United States Patent
Honma (10) Patent No.: US 12,091,753 B2
(45) Date of Patent: Sep. 17, 2024

(54) SUBSTRATE PROCESSING APPARATUS

(71) Applicant: Tokyo Electron Limited, Tokyo (JP)

(72) Inventor: Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/527,999

(22) Filed: Dec. 4, 2023

(65) Prior Publication Data

US 2024/0254628 A1 Aug. 1, 2024

Related U.S. Application Data (60) Provisional application No. 63/495,629, filed on Apr. 12, 2023.

(30) Foreign Application Priority Data

Jan. 26, 2023 (JP) .................................. 2023-010028

(51) Int. Cl.
  *C23C 16/458* (2006.01)
  *C23C 16/455* (2006.01)
  (Continued)

(52) U.S. Cl.
  CPC .... *C23C 16/4583* (2013.01); *C23C 16/45544* (2013.01); *C23C 16/54* (2013.01);
  (Continued)

(58) Field of Classification Search
  None
  See application file for complete search history.

(56) References Cited

U.S. PATENT DOCUMENTS

2008/0236488 A1* 10/2008 Takeshita ............ C23C 16/4401
  438/758
2010/0068414 A1* 3/2010 Takahashi ........... H01L 21/6719
  118/728
(Continued)

FOREIGN PATENT DOCUMENTS

JP 2020-088394 6/2020
JP 2021-129118 9/2021
(Continued)

OTHER PUBLICATIONS

English Machine translation of Park et al. (KR20220132171A) retrieved from ESPACENET on Feb. 27, 2024 (Year: 2024).*

*Primary Examiner* — Ram N Kackar
*Assistant Examiner* — Laureen Chan
(74) *Attorney, Agent, or Firm* — IPUSA, PLLC (57) ABSTRACT

A substrate processing apparatus includes a processing module including a first sidewall and a second sidewall that are spaced apart in a first horizontal direction, and a transferring module that is configured to transfer a substrate to the processing module and that is disposed adjacent to the first sidewall. The processing module includes a first processing container and a second processing container that are adjacent to each other in a second horizontal direction perpendicular to the first horizontal direction. A maintenance opening common for performing maintenance on the first processing container and the second processing container is provided in the second sidewall. The maintenance opening is provided to include an intermediate position between the first processing container and the second processing container in the second horizontal direction.

13 Claims, 8 Drawing Sheets

(51) Int. Cl.
 *C23C 16/54* (2006.01)
 *H01L 21/67* (2006.01)
 *H01L 21/677* (2006.01)

(52) U.S. Cl.
 CPC .. *H01L 21/67161* (2013.01); *H01L 21/67178* (2013.01); *H01L 21/6719* (2013.01); *H01L 21/67757* (2013.01)

(56) References Cited

U.S. PATENT DOCUMENTS

| | | | |
|---|---|---|---|
| 2019/0198359 A1* | 6/2019 | Kamimura | H01L 21/6719 |
| 2020/0135512 A1* | 4/2020 | Oosterlaken | H01L 21/67766 |
| 2020/0168485 A1* | 5/2020 | Fluit | H01L 21/67109 |
| 2021/0305067 A1* | 9/2021 | Kamimura | H01J 37/32834 |
| 2021/0384046 A1* | 12/2021 | Ronner | H01L 21/68707 |

FOREIGN PATENT DOCUMENTS

| | | | |
|---|---|---|---|
| JP | 2021-158361 | | 10/2021 |
| KR | 20220132171 A | * | 9/2022 |
| WO | 2018/003072 | | 1/2018 |

* cited by examiner

SUBSTRATE PROCESSING APPARATUS

CROSS-REFERENCE TO RELATED APPLICATIONS

This patent application claims priority to U.S. Provisional Patent Application No. 63/495,629 filed on Apr. 12, 2023, and is based on and claims priority to Japanese Patent Application No. 2023-010028 filed on Jan. 26, 2023, the entire contents of which are incorporated herein by reference.

TECHNICAL FIELD

The present disclosure relates to a substrate processing apparatus.

BACKGROUND

In a batch type substrate processing apparatus, a technique in which two processing containers are disposed adjacent to each other in one apparatus and a space between utility boxes installed on rear sides of the processing containers is used as a common maintenance area is known (for example, see Patent Document 1).

RELATED ART DOCUMENT

Patent Document

[Patent Document 1] International Publication Pamphlet No. WO 2018/003072

SUMMARY

According to an aspect of the present disclosure, a substrate processing apparatus includes a processing module including a first sidewall and a second sidewall that are spaced apart in a first horizontal direction, and a transferring module that is configured to transfer a substrate to the processing module and that is disposed adjacent to the first sidewall. The processing module includes a first processing container and a second processing container that are adjacent to each other in a second horizontal direction perpendicular to the first horizontal direction. A maintenance opening common for performing maintenance on the first processing container and the second processing container is provided in the second sidewall. The maintenance opening is provided to include an intermediate position between the first processing container and the second processing container in the second horizontal direction.

DETAILED DESCRIPTION OF EMBODIMENTS

In the following, non-restrictive embodiments of the present disclosure will be described with reference to the accompanying drawings. In all of the accompanying drawings, the same or corresponding members or components are denoted by the same or corresponding reference symbols, and duplicated description is omitted. In the present specification, the X-axis direction, the Y-axis direction, and the Z-axis direction are directions perpendicular to each other. The X-axis direction and the Y-axis direction are horizontal directions, and the Z-axis direction is a vertical direction. The X-axis direction is an example of a first horizontal direction, and the Y-axis direction is an example of a second horizontal direction.

First Embodiment

Figure 1:
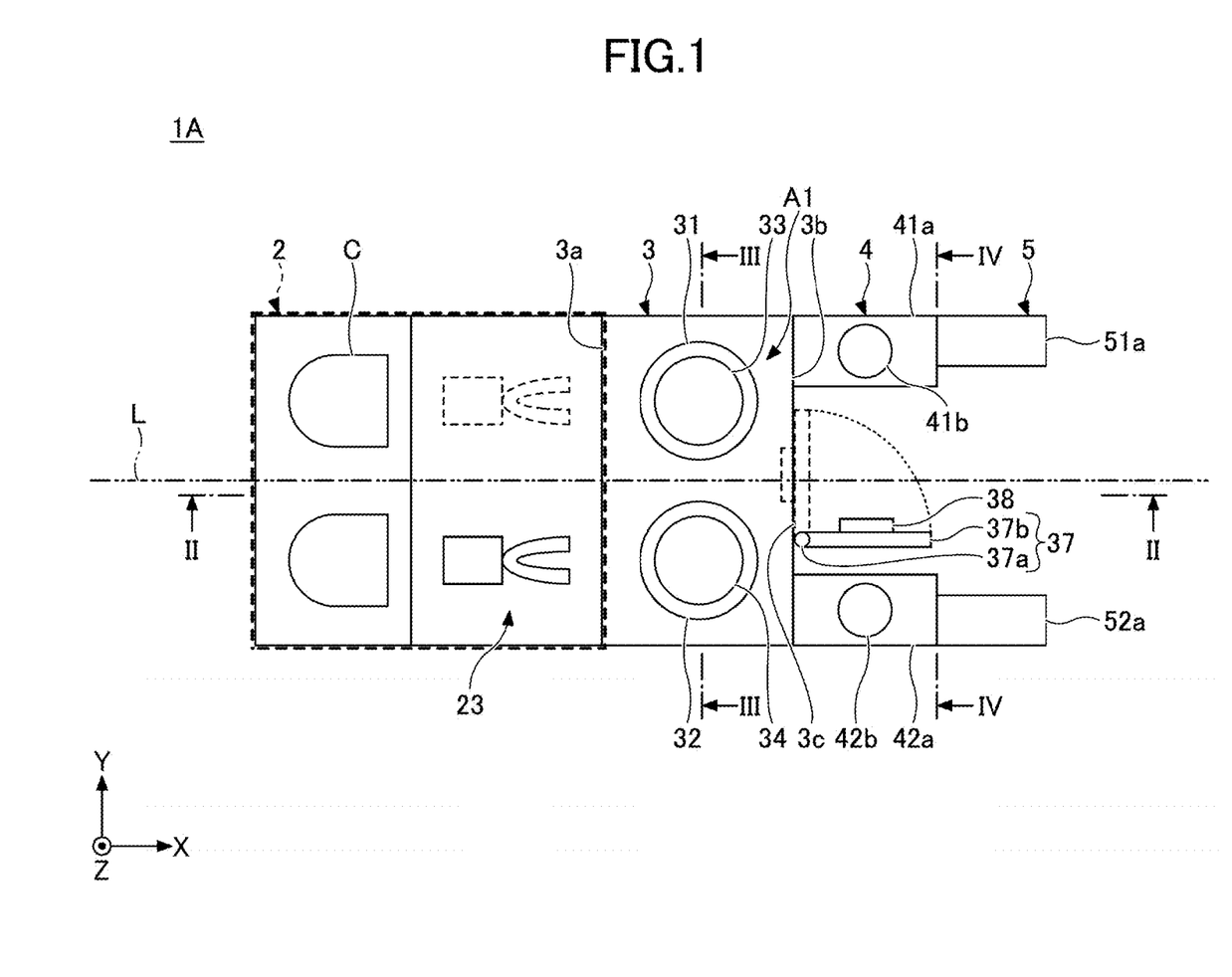
FIG. 1 is a plan view illustrating a substrate processing apparatus according to a first embodiment.
Figure 2:
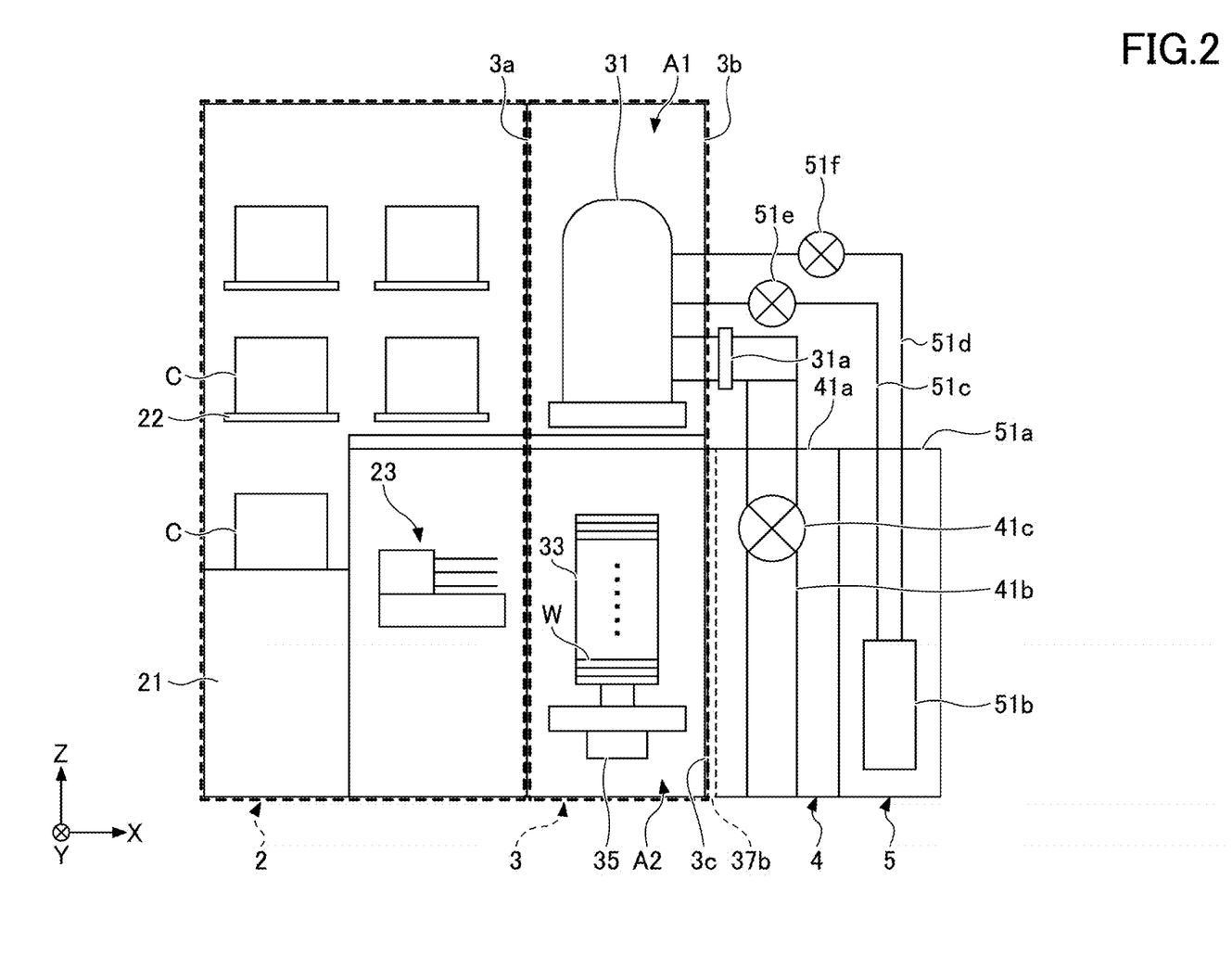
FIG. 2 is a cross-sectional view taken along the line II-II in FIG. 1.
Figure 3A:
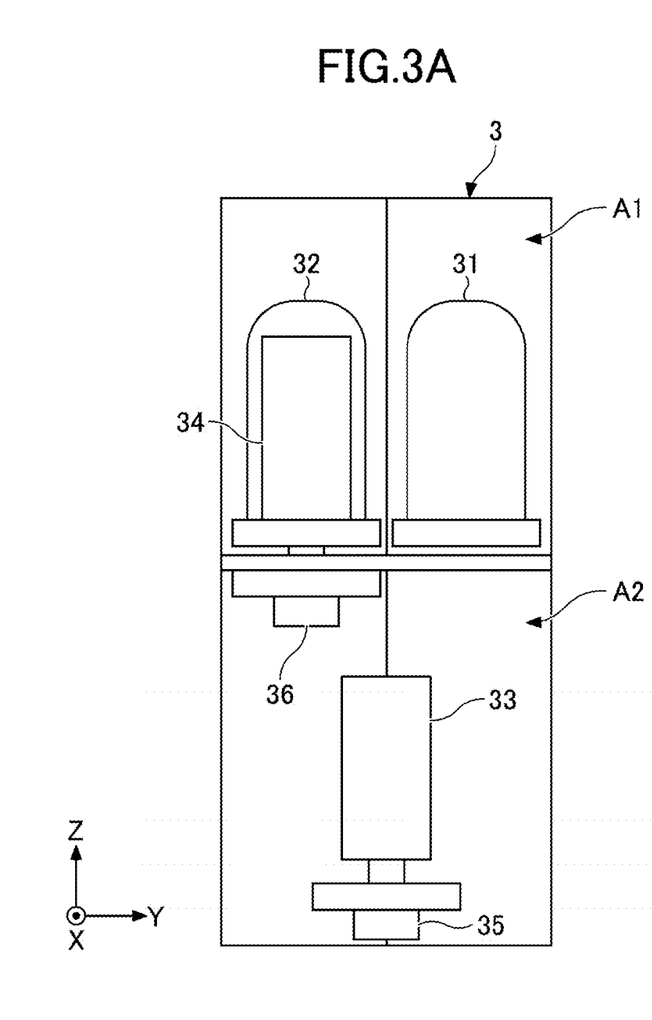
FIG. 3A is a cross-sectional view taken along the line III-III of FIG. 1.
Figure 3B:
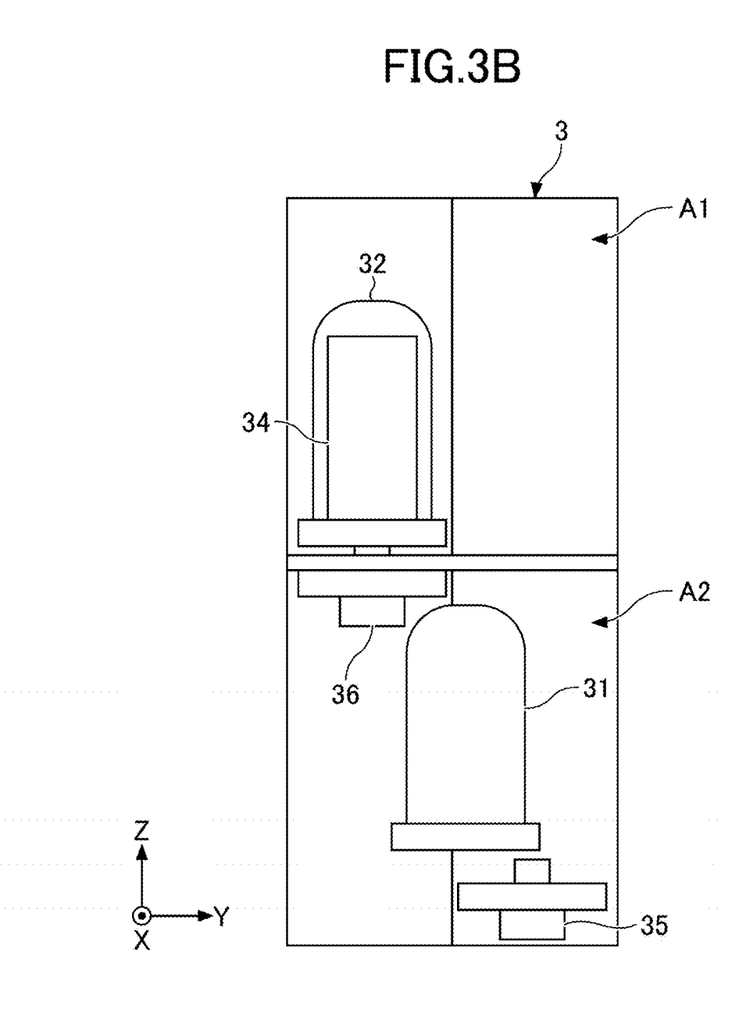
FIG. 3B is a cross-sectional view taken along the line III-III of FIG. 1.
Figure 4:
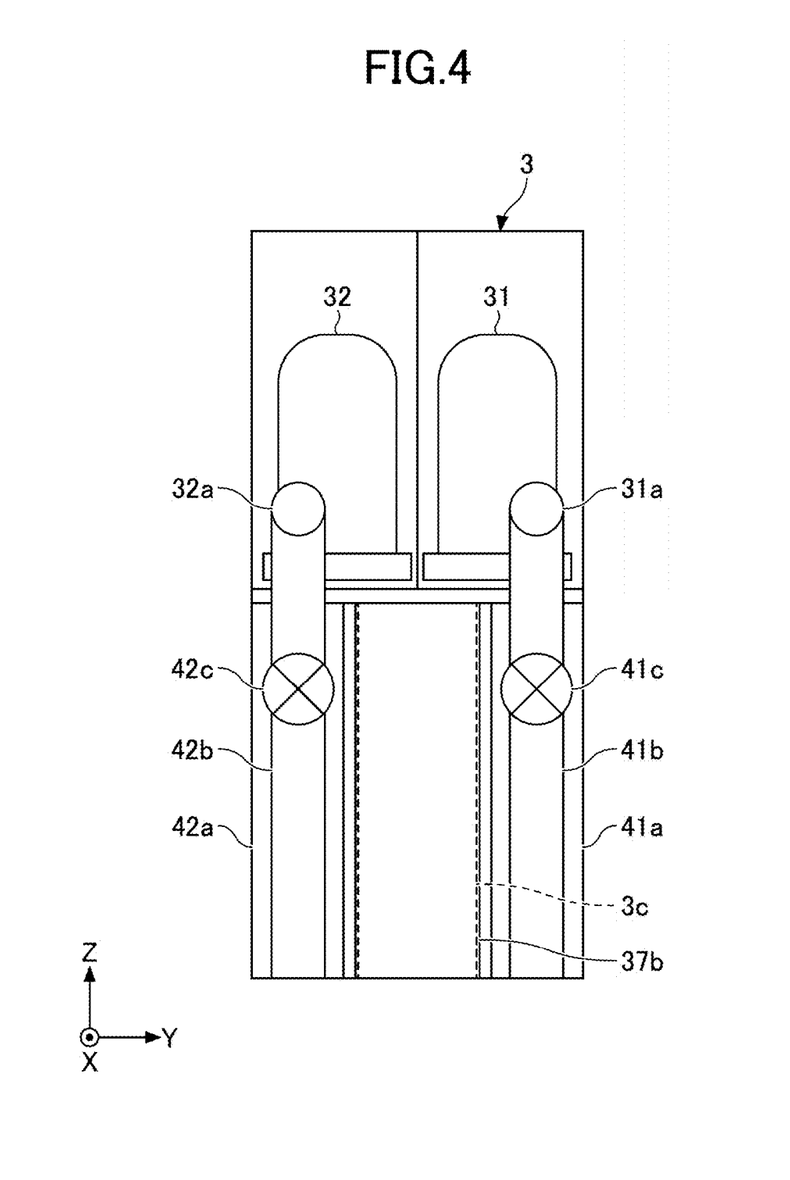
FIG. 4 is a cross-sectional view taken along the line IV-IV of FIG. 1.

A substrate processing apparatus 1A according to a first embodiment will be described with reference to FIGS. 1 to 4. FIG. 1 is a plan view illustrating the substrate processing apparatus 1A according to the first embodiment. FIG. 2 is a cross-sectional view taken along the line II-II of FIG. 1. FIG. 3A and FIG. 3B are cross-sectional views taken along the line III-III of FIG. 1. FIG. 3A illustrates a case where a first boat 33 is located when the first boat 33 is loaded into or unloaded from a processing module 3. FIG. 3B illustrates a case where a first processing container 31 is located when the first processing container 31 is loaded into or unloaded from the processing module 3. FIG. 4 is a cross-sectional view taken along the line IV-IV of FIG. 1.

The substrate processing apparatus 1A includes a transferring module 2, the processing module 3, an exhaust section 4, and a gas supply 5.

The transferring module 2 is disposed adjacent to a first sidewall 3a of the processing module 3. The transferring module 2 transfers the substrate W to the processing module 3. The transferring module 2 includes a load port 21, a stocker 22, and a substrate transfer device 23.

The load port 21 is disposed in the transferring module 2 on the negative side in the X-axis direction. Multiple (for example, two) load ports 21 are disposed along the Y-axis direction. However, the number of the load ports 21 is not particularly limited. A cassette C is placed on the load port 21. The cassette C accommodates multiple (for example, 25) substrates W. The cassette C is loaded into and unloaded from the load port 21. The cassette C horizontally holds each substrate W. The cassette C is, for example, a front opening unified pod (FOUP).

Multiple (for example, two) stockers 22 are disposed along the Z-axis direction in the transferring module 2 on the negative side in the X-axis direction. Multiple (for example, two) stockers 22 are disposed along the Z-axis direction in the transferring module 2 on the positive side in the X-axis direction. Multiple stockers 22 may be disposed in the Y-axis direction. However, the number of the stockers 22 is not particularly limited. The stocker 22 temporarily stores the cassette C.

The substrate transfer device 23 transfers the substrates W between the cassette C placed on the load port 21; and the first boat 33 and a second boat 34. The substrate transfer device 23 simultaneously transfers, for example, multiple substrates W. For example, the substrate transfer device 23 unloads the substrates W before processing from the cassette C placed on the load port 21 and transfers the unloaded substrates W to the first boat 33 and the second boat 34. For example, the substrate transfer device 23 unloads the substrates W after processing from the first boat 33 and the second boat 34, and transfers the unloaded substrates W to the cassette C placed on the load port 21.

The transferring module 2 may include a cassette transfer device that transfers the cassette C between the load port 21 and the stocker 22. The transferring module 2 may include a loader for transferring the substrate to and from the substrate transfer device 23, in addition to the load port 21.

The processing module 3 includes a processing chamber A1 and a transfer chamber A2. The processing chamber A1 and the transfer chamber A2 are adjacent to each other in the Z-axis direction. The transfer chamber A2 is located on the negative side of the processing chamber A1 in the Z-axis direction. The processing module 3 has the first sidewall 3a and a second sidewall 3b. The first sidewall 3a is located on the negative side of the processing module 3 in the X-axis direction. The second sidewall 3b is located on the positive side of the processing module 3 in the X-axis direction. The first sidewall 3a and the second sidewall 3b are spaced apart in the X-axis direction. Each of the first sidewall 3a and the second sidewall 3b extends from an end of the processing module 3 on the negative side in the Y-axis direction to an end of the processing module 3 on the positive side in the Y-axis direction. Each of the first sidewall 3a and the second sidewall 3b extends from a lower end of the transfer chamber A2 to an upper end of the processing chamber A1.

The processing module 3 includes the first processing container 31, a second processing container 32, the first boat 33, the second boat 34, a first drive mechanism 35, a second drive mechanism 36, a maintenance door 37, and a clean section 38.

The first processing container 31 and the second processing container 32 are disposed in the processing chamber A1. The first processing container 31 and the second processing container 32 are disposed between the first sidewall 3a and the second sidewall 3b in the X-axis direction. The first processing container 31 and the second processing container 32 are disposed adjacent to each other in the Y-axis direction.

The first processing container 31 is heated by a heater, which is not illustrated. The first processing container 31 is configured to accommodate the first boat 33 holding the substrates W. A process gas is supplied into the first processing container 31 from the gas supply 5. The process gas is selected according to the type of processing. The process gas supplied into the first processing container 31 is exhausted by the exhaust section 4. Inside the first processing container 31, desired processing is performed on the substrates W held in the first boat 33 by the process gas supplied from the gas supply 5. The second processing container 32 may have the same configuration as that of the first processing container 3l.

The first boat 33 holds multiple substrates W in a shelf shape along the Z-axis direction such that multiple substrates W are horizontally placed in multiple levels in a vertical direction. The first boat 33 is movable between a transfer position (a position illustrated in FIG. 2), a process position, and a load/unload position (a position illustrated in FIG. 3A). The transfer position is a position below the first processing container 31. The transfer position may be directly below the first processing container 31. The process position is a position where the first boat 33 is accommodated in the first processing container 31 and is a position above the transfer position. The process position may be directly above the transfer position. The load/unload position is a position in the processing module 3 on the negative side in the Z-axis direction and a central position in the processing module 3 in the Y-axis direction. The load/unload position may be a position shifted from the transfer position on the positive side in the X-axis direction. In this case, the first boat 33 is easily loaded into and unloaded from the processing module 3.

For example, the first boat 33 moves to the transfer position when the substrate W is transferred between the first boat 33 and the substrate transfer device 23. For example, the first boat 33 moves to the process position when the desired processing is performed on the substrate W. For example, the first boat 33 moves to the load/unload position when the first boat 33 is unloaded from the processing module 3 for maintenance.

The second boat 34 holds multiple substrates W in a shelf shape along the Z-axis direction such that multiple substrates W are horizontally placed in multiple levels in a vertical direction. The second boat 34 is movable between the transfer position, the process position (the position illustrated in FIG. 3A and FIG. 3B), and the load/unload position. The transfer position is a position below the second processing container 32. The transfer position may be directly below the second processing container 32. The process position is a position where the second boat 34 is accommodated in the second processing container 32 and is a position above the transfer position. The process position may be directly above the transfer position. The load/unload position is a position in the processing module 3 on the negative side in the Z-axis direction and a central position in the processing module 3 in the Y-axis direction. The load/unload position may be a position in the processing module 3 on the positive side in the X-axis direction. In this case, the second boat 34 is easily loaded into and unloaded from the processing module 3. The load/unload position of the second boat 34 may be the same as the load/unload position of the first boat 33.

For example, the second boat 34 moves to the transfer position when the substrate W is transferred between the second boat 34 and the substrate transfer device 23. For example, the second boat 34 moves to the process position when the desired processing is performed on the substrate W. For example, the second boat 34 moves to the load/unload position when the second boat 34 is unloaded from the processing module 3 for maintenance.

The first drive mechanism 35 is configured to move the first boat 33 at least between the transfer position and the process position. The first drive mechanism 35 may include a boat elevator. The first drive mechanism 35 may be configured to move the first boat 33 between the transfer position, the process position, and the load/unload position.

The second drive mechanism 36 is configured to move the second boat 34 at least between the transfer position and the process position. The second drive mechanism 36 may include a boat elevator. The second drive mechanism 36 may be configured to move the second boat 34 between the transfer position, the process position, and the load/unload position.

A maintenance opening 3c is provided in the second sidewall 3b. The maintenance opening 3c is provided in the second sidewall 3b on the negative side in the Z-axis direction. The maintenance opening 3c is provided at the same height position as the transfer chamber A2. The maintenance opening 3c is provided to include an intermediate position between the first processing container 31 and the second processing container 32 in the Y-axis direction. The maintenance opening 3c is provided between a first exhaust box 41a and a second exhaust box 42a in the Y-axis direction. The maintenance opening 3c is an opening for performing maintenance on the processing module 3. The maintenance opening 3c is a common opening used when each of the first processing container 31, the second processing container 32, the first boat 33, and the second boat 34 is loaded into and unloaded from the processing module 3. Therefore, the maintenance opening 3c has a size sufficient to allow each of the first processing container 31, the second processing container 32, the first boat 33, and the second boat 34 to pass through the maintenance opening 3c.

For example, the maintenance opening 3c is used when the first processing container 31 (the second processing container 32) is unloaded from the inside of the processing module 3 for replacement due to breakage of the first processing container 3l (the second processing container 32) or cleaning of the first processing container 31 (the second processing container 32). For example, the maintenance opening 3c is used when the first boat 33 (the second boat 34) is unloaded from the inside of the processing module 3 for replacement due to breakage of the first boat 33 (the second boat 34) or cleaning of the first boat 33 (the second boat 34).

The maintenance door 37 horizontally rotates to open and close the maintenance opening 3c. The maintenance door 37 includes a hinge 37a and a door body 37b. The hinge 37a connects the second sidewall 3b to the door body 37b. The hinge 37a is provided, for example, on the negative side in the Y-axis direction. The door body 37b may be horizontally rotatable via the hinge 37a with respect to the second sidewall 3b. When the door body 37b is opened, each of the first processing container 31, the second processing container 32, the first boat 33, and the second boat 34 can be loaded and unloaded through the maintenance opening 3c. In FIG. 1, the door body 37b in an open state is illustrated by a solid line, the door body 37b in a closed state is illustrated by a broken line, and the trace of the tip of the door body 37b when the door body 37b is opened and closed is illustrated by a dotted line.

The clean section 38 is attached to the door body 37b. The clean section 38 is configured to circulate clean air in the transfer chamber A2. The clean air is, for example, an inert gas. The clean air supplied into the transfer chamber A2 is exhausted from the inside of the transfer chamber A2 by an exhaust section (which is not illustrated) installed on the first sidewall 3a facing the clean section 38, and is supplied again into the transfer chamber A2 from the clean section 38.

The exhaust section 4 includes the first exhaust box 41a, a first exhaust pipe 41b, a first pressure control valve 41c, the second exhaust box 42a, a second exhaust pipe 42b, and a second pressure control valve 42c.

The first exhaust box 41a is disposed adjacent to the second sidewall 3b on the positive side of the processing module 3 in the Y-axis direction. The first exhaust pipe 41b connects an exhaust port 31a of the first processing container 31 to a vacuum pump (which is not illustrated). A portion of the first exhaust pipe 41b between the one end and the other end of the first exhaust pipe 41b is accommodated inside the first exhaust box 41a. The first pressure control valve 41c is provided inside the first exhaust box 41a. The first pressure control valve 41c is provided in the first exhaust pipe 41b. The first pressure control valve 41c controls the internal pressure of the first processing container 31 to a desired pressure.

The second exhaust box 42a is disposed adjacent to the second sidewall 3b on the negative side of the processing module 3 in the Y-axis direction. The second exhaust box 42a is disposed spaced apart from the first exhaust box 41a in the Y-axis direction. The first exhaust box 41a and the second exhaust box 42a may be disposed to be symmetric with respect to a virtual line L located at equal distances from the center of the first processing container 31 and the center of the second processing container 32. An area between the first exhaust box 41a and the second exhaust box 42a is a maintenance area in which the maintenance opening 3c is exposed. The second exhaust pipe 42b connects an exhaust port 32a of the second processing container 32 to a vacuum pump (which is not illustrated). A portion of the second exhaust pipe 42b between the one end and the other end of the second exhaust pipe 42b is accommodated inside the second exhaust box 42a. The second pressure control valve 42c is provided inside the second exhaust box 42a. The second pressure control valve 42c is provided in the second exhaust pipe 42b. The second pressure control valve 42c controls the internal pressure of the second processing container 32 to a desired pressure.

The gas supply 5 includes a first supply box 51a, a first supply 51b, first supply pipes 51c and 51d, and first supply valves 51e and 51f.

The first supply box 51a is disposed adjacent to the first exhaust box 41a on the positive side in the X-axis direction. The first supply 51b is accommodated inside the first supply box 51a. The first supply pipes 51c and 51d connect the first supply 51b to respective nozzles (which are not illustrated) for supplying a process gas into the first processing container 31. The first supply valve 51e is provided in the first supply pipe 51c. The first supply valve 51f is provided in the first supply pipe 51d. Mass flow controllers (which are not illustrated) may be provided in the first supply pipe 51c and the first supply pipe 51d. The first supply 51b supplies a process gas into the first processing container 31 through the first supply pipes 51c and 51d.

The gas supply 5 includes a second supply box 52a, a second supply (which is not illustrated), a second supply pipe (which is not illustrated), and a second supply valve (which is not illustrated).

The second supply box 52a is disposed adjacent to the second exhaust box 42a on the positive side in the X-axis direction. The second supply, the second supply pipe, and the second supply valve may have the substantially same configurations as the first supply 51b, the first supply pipes 51c and 51d, and the first supply valves 51e and 51f.

As described above, the substrate processing apparatus 1A includes the processing module 3 having the first sidewall 3a and the second sidewall 3b spaced apart from each other in the X-axis direction, and the transferring module 2 disposed adjacent to the first sidewall 3a and configured to transfer the substrate W to the processing module 3. The processing module 3 includes the first processing container 31 and the second processing container 32 adjacent to each other in the Y-axis direction. The maintenance opening 3c is provided in the second sidewall 3b and is common for performing maintenance on the first processing container 31 and the second processing container 32. In this case, the opening width of the maintenance opening 3c can be reduced to about half of the sum of the opening widths of two maintenance openings when the maintenance openings are individually provided for the first processing container 31 and the second processing container 32. This can increase the width (the length in the Y-axis direction) of the first exhaust box 41a and the second exhaust box 42a with the first exhaust box 41a and the second exhaust box 42a being disposed adjacent to the processing module 3. Therefore, the diameters of the first exhaust pipe 41b and the second exhaust pipe 42b can be increased with the first exhaust pipe 41b and the second exhaust pipe 42b being respectively disposed close to the first processing container 31 and the second processing container 32. As a result, the exhaust efficiency can be improved while the footprint of the substrate processing apparatus 1A is reduced.

For example, when a film is formed on the substrate W by atomic layer deposition (ALD), the exhaust time can be shortened by the improvement of the exhaust efficiency, thereby improving the productivity.

For example, when a film is formed on the surface of the substrate W on which a pattern is formed, the processing using the process gas at a large flow rate can be performed due to the improvement of the exhaust efficiency, thereby suppressing the occurrence of the loading effect regardless of the shape of the pattern.

Second Embodiment

Figure 5:
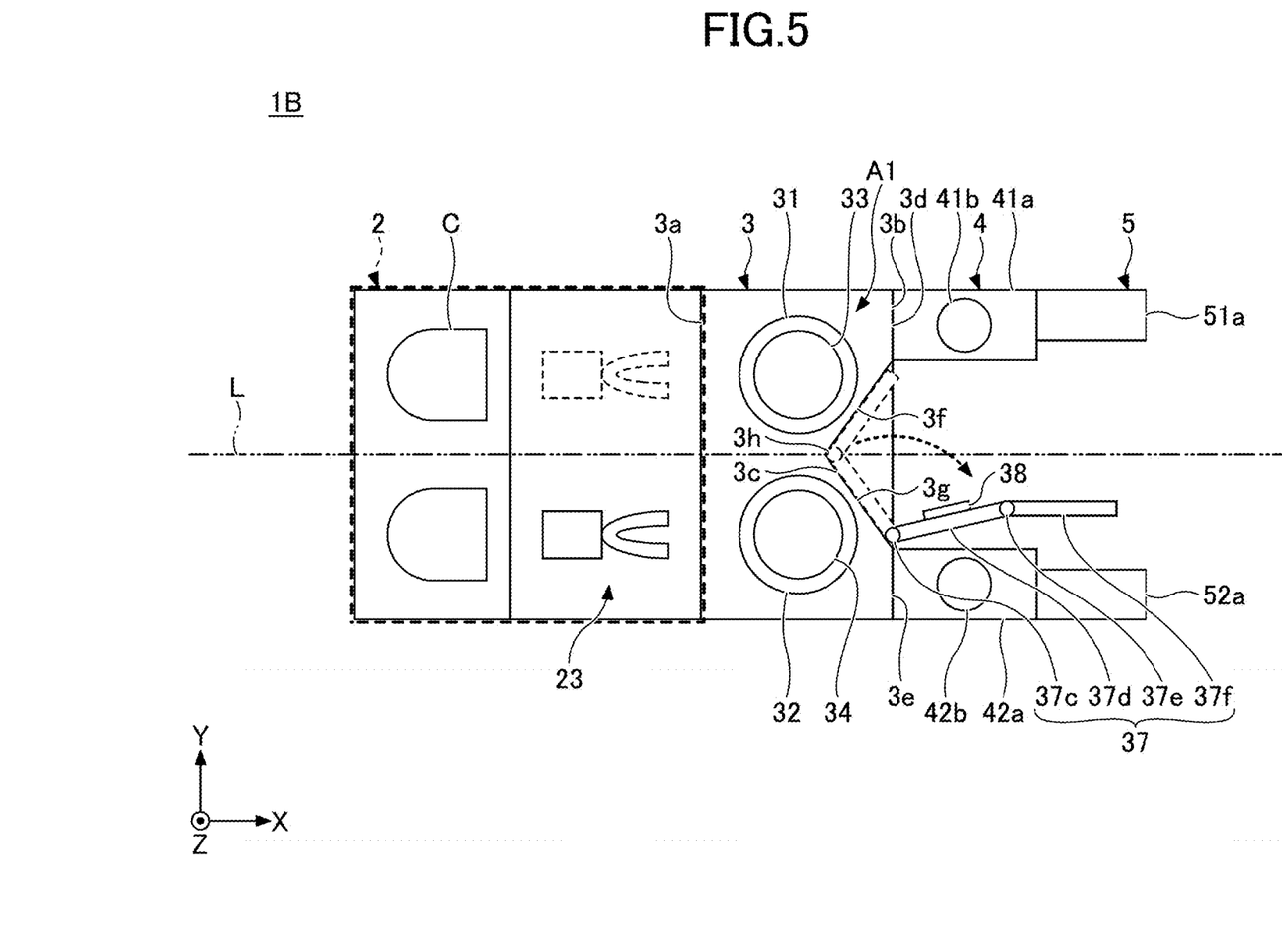
FIG. 5 is a plan view illustrating a substrate processing apparatus according to a second embodiment.

A substrate processing apparatus 1B according to a second embodiment will be described with reference to FIG. 5. FIG. 5 is a plan view illustrating the substrate processing apparatus 1B according to the second embodiment.

The substrate processing apparatus 1B is different from the substrate processing apparatus 1A in that the second sidewall 3b has a pair of second inclined portions 3f and 3g disposed in a V-shape so as to have a second vertex 3h protruding toward the first sidewall 3a when viewed in the Z-axis direction. In the following, points different from the substrate processing apparatus 1A will be mainly described.

As illustrated in FIG. 5, the second sidewall 3b has a pair of second non-inclined portions 3d and 3e and the pair of second inclined portions 3f and 3g.

The pair of second non-inclined portions 3d and 3e are disposed spaced apart from each other in the Y-axis direction. The second non-inclined portion 3d and the second non-inclined portion 3e may be disposed to be symmetric with respect to the virtual line L located at equal distances from the center of the first processing container 31 and the center of the second processing container 32. The first exhaust box 41a is disposed adjacent to the second non-inclined portion 3d. The second exhaust box 42a is disposed adjacent to the second non-inclined portion 3e.

The pair of second inclined portions 3f and 3g is disposed between the second non-inclined portion 3d and the second non-inclined portion 3e in the Y-axis direction. When viewed in the Z-axis direction, the pair of second inclined portions 3f and 3g is disposed in a V-shape so as to have the second vertex 3h protruding toward the first sidewall 3a. The second vertex 3h is positioned between the first processing container 31 and the second processing container 32 in the Y-axis direction. The second inclined portion 3f and the second inclined portion 3g may be disposed to be symmetric with respect to the virtual line L located at equal distances from the center of the first processing container 31 and the center of the second processing container 32. The angle of the second vertex 3h is, for example, 90° or greater.

The maintenance opening 3c is provided continuously over an area from the second inclined portion 3f to the second inclined portion 3g. The maintenance opening 3c is provided, for example, over the entirety of the pair of second inclined portions 3f and 3g when viewed in the Z-axis direction. In this case, the opening width of the maintenance opening 3c is widened, thereby facilitating each of the first processing container 31, the second processing container 32, the first boat 33, and the second boat 34 to be loaded into and unloaded from the processing module 3 when performing maintenance on the processing module 3. However, the maintenance opening 3c may be provided only in part of the pair of second inclined portions 3f and 3g when viewed in the Z-axis direction.

The maintenance door 37 horizontally rotates to open and close the maintenance opening 3c. The maintenance door 37 includes a first hinge 37c, a first door body 37d, a second hinge 37e, and a second door body 37f. The first hinge 37c connects the second sidewall 3b to the first door body 37d. The first hinge 37c is provided, for example, on the boundary between the second non-inclined portion 3e and the second inclined portion 3g. The first door body 37d may be horizontally rotatable with respect to the second sidewall 3b via the first hinge 37c. The second hinge 37e connects the first door body 37d to the second door body 37f. The second door body 37f may be horizontally rotatable with respect to the first door body 37d via the second hinge 37e. When the first door body 37d and the second door body 37f are opened, each of the first processing container 31, the second processing container 32, the first boat 33, and the second boat 34 can be loaded and unloaded through the maintenance opening 3c. In FIG. 5, the first door body 37d and the second door body 37f in an open state are illustrated by a solid line, and the first door body 37d and the second door body 37f in a closed state are illustrated by a broken line.

As described above, according to the substrate processing apparatus 1B, when viewed in the Z-axis direction, the second sidewall 3b includes the pair of second inclined portions 3f and 3g disposed in a V-shape so as to have the second vertex 3h protruding toward the first sidewall 3a. In this case, without changing the opening length of the maintenance opening 3c, the length occupied by the maintenance opening 3c in the width direction (the Y-axis direction) of the substrate processing apparatus 1B is reduced. This can reduce the width of the substrate processing apparatus 1B.

Third Embodiment

Figure 6:
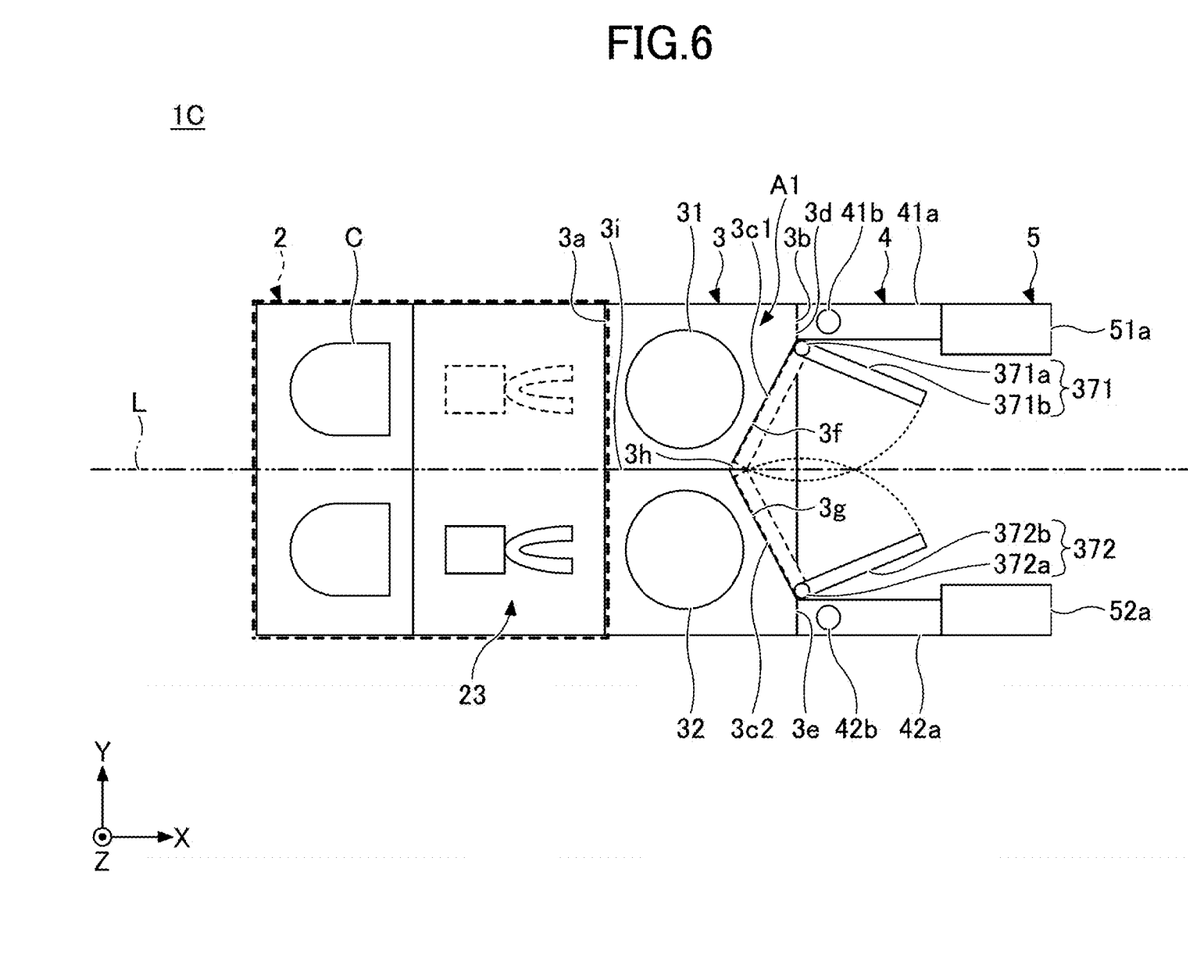
FIG. 6 is a plan view illustrating a substrate processing apparatus according to a third embodiment.

A substrate processing apparatus 1C according to a third embodiment will be described with reference to FIG. 6. FIG. 6 is a plan view illustrating the substrate processing apparatus 1C according to the third embodiment.

The substrate processing apparatus 1C is different from the substrate processing apparatus 1B in that individual maintenance openings (a first maintenance opening 3c1 and a second maintenance opening 3c2) are respectively provided at the pair of second inclined portions 3f and 3g. In the following, points different from the substrate processing apparatus 1B will be mainly described.

As illustrated in FIG. 6, the second sidewall 3b has the pair of second non-inclined portions 3d and 3e and the pair of second inclined portions 3f and 3g.

The pair of second inclined portions 3f and 3g is disposed between the second non-inclined portion 3d and the second non-inclined portion 3e in the Y-axis direction. When viewed in the Z-axis direction, the pair of second inclined portions 3f and 3g is disposed in a V-shape so as to have the second vertex 3h protruding toward the first sidewall 3a. The second vertex 3h is positioned between the first processing container 31 and the second processing container 32 in the Y-axis direction. The second inclined portion 3f and the second inclined portion 3g may be disposed to be symmetric with respect to the virtual line L located at equal distances from the center of the first processing container 31 and the center of the second processing container 32.

The first maintenance opening 3c1 is provided in the second inclined portion 3f. The second maintenance opening 3c2 is provided in the second inclined portion 3g. The first maintenance opening 3c1 and the second maintenance opening 3c2 are provided at the same height position as the transfer chamber A2. The first maintenance opening 3c1 and the second maintenance opening 3c2 are provided between the first exhaust box 41a and the second exhaust box 42a in the Y-axis direction. The first maintenance opening 3c1 and the second maintenance opening 3c2 are openings for performing maintenance on the processing module 3. The first maintenance opening 3c1 is an opening used when each of the first processing container 31 and the first boat 33 is loaded into and unloaded from the processing module 3. The second maintenance opening 3c2 is an opening used when each of the second processing container 32 and the second boat 34 is loaded into and unloaded from the processing module 3. The first processing container 31 and the first boat 33 are loaded and unloaded along, for example, a direction perpendicular to the second inclined portion 3f (the first maintenance opening 3c1). The second processing container 32 and the second boat 34 are loaded and unloaded along, for example, a direction perpendicular to the second inclined portion 3g (the second maintenance opening 3c2). The direction in which the first processing container 31 and the first boat 33 are loaded and unloaded and the direction in which the second processing container 32 and the second boat 34 are loaded and unloaded may intersect. A first maintenance door 371 is provided at the first maintenance opening 3c1. A second maintenance door 372 is provided at the second maintenance opening 3c2.

The first maintenance door 371 horizontally rotates to open and close the first maintenance opening 3c1. The first maintenance door 371 includes a first hinge 371a and a first door body 371b. The first hinge 371a connects the second sidewall 3b to the first door body 371b. The first hinge 371a is provided, for example, on the boundary between the second non-inclined portion 3d and the second inclined portion 3f. The first door body 371b may be horizontally rotatable with respect to the second sidewall 3b via the first hinge 371a. When the first door body 371b is opened, each of the first processing container 31 and the first boat 33 can be loaded and unloaded through the first maintenance opening 3c1. In FIG. 6, the first door body 371b in an open state is illustrated by a solid line, the first door body 371b in a closed state is illustrated by a broken line, and the trace of the tip of the first door body 371b when the first door body 371b is opened and closed is illustrated by a dotted line.

The second maintenance door 372 horizontally rotates to open and close the second maintenance opening 3c2. The second maintenance door 372 includes a second hinge 372a and a second door body 372b. The second hinge 372a connects the second sidewall 3b to the second door body 372b. The second hinge 372a is provided, for example, on the boundary between the second non-inclined portion 3e and the second inclined portion 3g. The second door body 372b may be horizontally rotatable with respect to the second sidewall 3b via the second hinge 372a. When the second door body 372b is opened, each of the second processing container 32 and the second boat 34 can be loaded and unloaded through the second maintenance opening 3c2. The rotation trace of the second door body 372b may overlap the rotation trace of the first door body 371b when viewed in the Z-axis direction. In FIG. 6, the second door body 372b in an open state is illustrated by a solid line, the second door body 372b in a closed state is illustrated by a broken line, and the trace of the tip of the second door body 372b when the second door body 372b is opened and closed is illustrated by a dotted line.

The processing module 3 may include a partition wall 3l that partitions the first processing container 31 and the second processing container 32. The clean section 38 may be provided on the partition wall 3i.

As described above, according to the substrate processing apparatus 1C, when viewed in the Z-axis direction, the second sidewall 3b has the pair of second inclined portions 3f and 3g disposed in a V-shape so as to have the second vertex 3h protruding toward the first sidewall 3a. In this case, without changing the opening widths of the respective maintenance openings (the first maintenance opening 3c1 and the second maintenance opening 3c2), the length occupied by the respective maintenance openings in the width direction (the Y-axis direction) of the substrate processing apparatus 1C is reduced. This can reduce the width of the substrate processing apparatus 1C.

Fourth Embodiment

Figure 7:
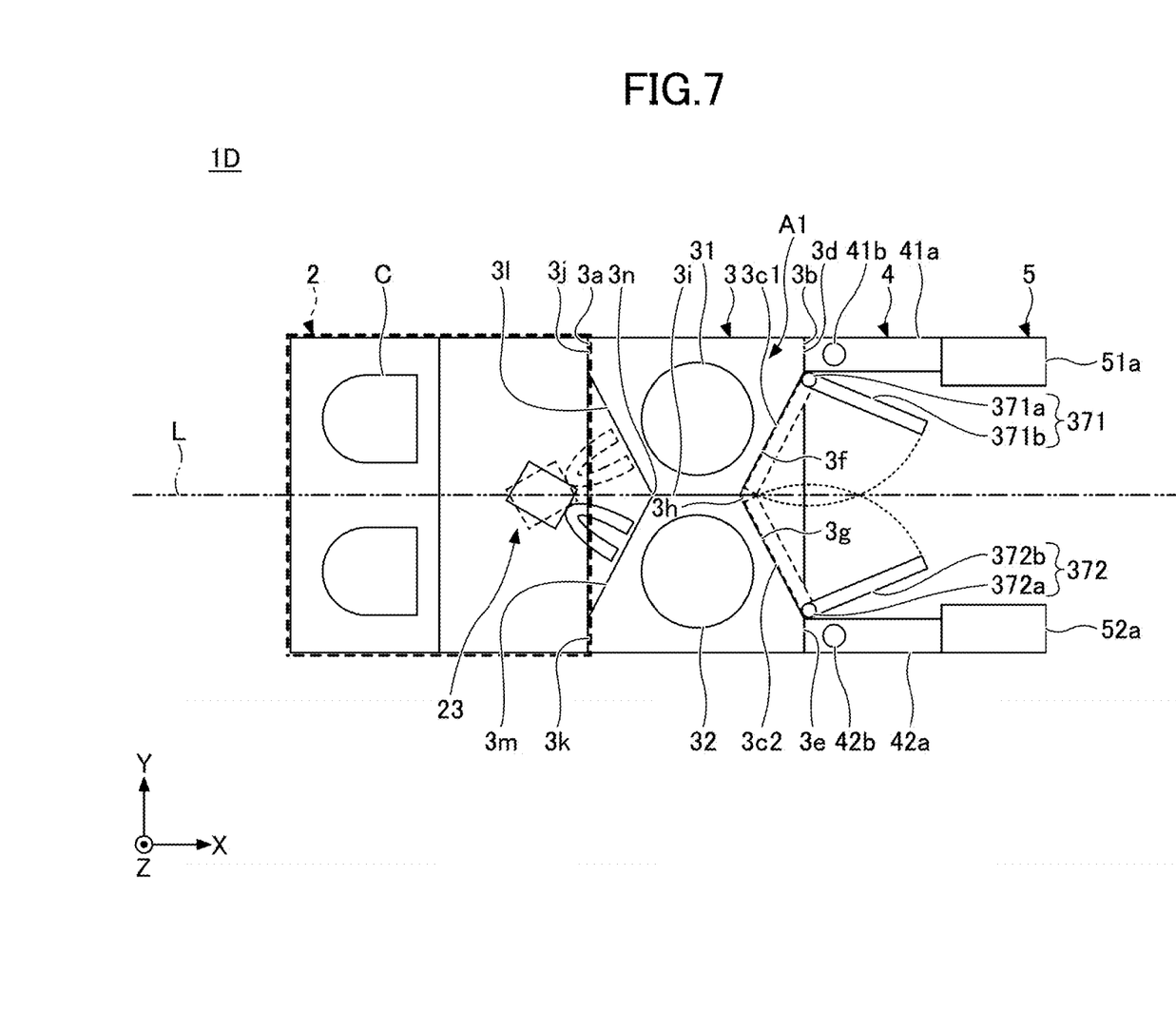
FIG. 7 is a plan view illustrating a substrate processing apparatus according to a fourth embodiment.

A substrate processing apparatus 1D according to a fourth embodiment will be described with reference to FIG. 7. FIG. 7 is a plan view illustrating the substrate processing apparatus 1D according to the fourth embodiment.

The substrate processing apparatus 1D is different from the substrate processing apparatus 1C in that the first sidewall 3a has a pair of first inclined portions 3l and 3m disposed in a V-shape so as to have a first vertex 3n protruding toward the second sidewall 3b when viewed in the Z-axis direction. In the following, points different from the substrate processing apparatus 1C will be mainly described.

As illustrated in FIG. 7, the first sidewall 3a has a pair of first non-inclined portions 3j and 3k and the pair of first inclined portions 3l and 3m.

The pair of first non-inclined portions 3j and 3k are disposed spaced apart from each other in the Y-axis direction. The first non-inclined portion 3j and the first non-inclined portion 3k may be disposed to be symmetric with respect to the virtual line L located at equal distances from the center of the first processing container 31 and the center of the second processing container 32.

The pair of first inclined portions 3l and 3m is disposed between the first non-inclined portion 3j and the first non-inclined portion 3k in the Y-axis direction. When viewed in the Z-axis direction, the pair of first inclined portions 3l and 3m is disposed in a V-shape so as to have the first vertex 3n protruding toward the second sidewall 3b. The first vertex 3n is positioned between the first processing container 31 and the second processing container 32 in the Y-axis direction. The first inclined portion 3l and the first inclined portion 3m may be disposed to be symmetric with respect to the virtual line L located at equal distances from the center of the first processing container 31 and the center of the second processing container 32. The angle of the first vertex 3n is, for example, 90° or greater.

As described above, according to the substrate processing apparatus 1D, when viewed in the Z-axis direction, the first sidewall 3a has the pair of first inclined portions 3l and 3m disposed in a V-shape so as to have the first vertex 3n protruding toward the second sidewall 3b. In this case, a space in which the substrate transfer device 23 can move is expanded. Therefore, for example, even when the width of the substrate processing apparatus 1D is small and the space in which the substrate transfer device 23 can move in the Y-axis direction is small, the substrate transfer device 23 can access each of the boats (the first boat 33 and the second boat 34) from the vicinity of the center in the Y-axis direction. Additionally, the moving distance of the substrate transfer device 23 in the Y-axis direction when the substrate W is transferred to the boat at a position facing the cassette C placed on the load port 21 is reduced, thereby shortening the transfer time of the substrate W.

Fifth Embodiment

Figure 8:
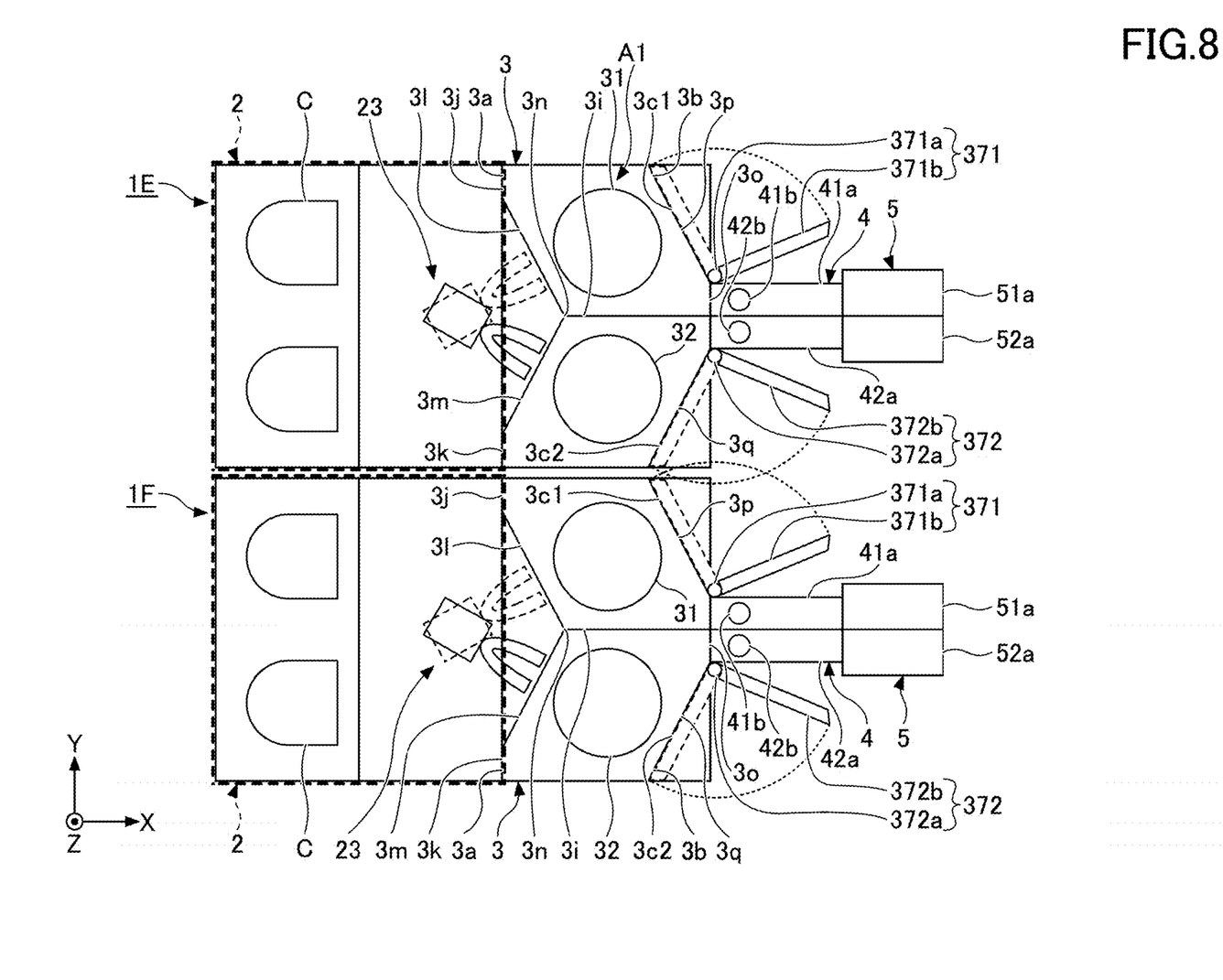
FIG. 8 is a plan view illustrating a substrate processing apparatus according to a fifth embodiment.

A substrate processing apparatus 1E according to a fifth embodiment will be described with reference to FIG. 8. FIG. 8 is a plan view illustrating the substrate processing apparatus 1E according to the fifth embodiment.

The substrate processing apparatus 1E is different from the substrate processing apparatus 1D in that the maintenance area is shared with the substrate processing apparatus 1F disposed adjacent to the substrate processing apparatus 1E. In the following, points different from the substrate processing apparatus 1D will be mainly described. The substrate processing apparatus 1F may have the same configuration as the substrate processing apparatus 1E.

As illustrated in FIG. 8, the second sidewall 3b has a second non-inclined portion 30, a second inclined portion 3p, and a second inclined portion 3q.

The second non-inclined portion 30 is provided at the intermediate position of the second sidewall 3b in the Y-axis direction. The first exhaust box 41a and the second exhaust box 42a are disposed adjacent to the second non-inclined portion 30. The first exhaust box 41a and the second exhaust box 42a are disposed adjacent to each other in the Y-axis direction.

The second inclined portion 3p is positioned on the positive side of the second non-inclined portion 30 in the Y-axis direction. The second inclined portion 3p is located further to the negative side in the X-axis direction with increasing the distance from the second non-inclined portion 30. The second inclined portion 3q is positioned on the negative side of the second non-inclined portion 30 in the Y-axis direction. The second inclined portion 3q is located further to the negative side in the X-axis direction with increasing the distance from the second non-inclined portion 30.

The first maintenance opening 3c1 is provided in the second inclined portion 3p. The second maintenance opening 3c2 is provided in the second inclined portion 3q. Each of the first maintenance opening 3c1 and the second maintenance opening 3c2 is provided at the same height position as the transfer chamber A2. The first maintenance opening 3c1 and the second maintenance opening 3c2 are openings for performing maintenance on the processing module 3. The first maintenance opening 3c1 is an opening used when each of the first processing container 31 and the first boat 33 is loaded into and unloaded from the processing module 3. The second maintenance opening 3c2 is an opening used when each of the second processing container 32 and the second boat 34 is loaded into and unloaded from the processing module 3. The first maintenance door 371 is provided at the first maintenance opening 3c1. The second maintenance door 372 is provided at the second maintenance opening 3c2.

The second maintenance opening 3c2 of the substrate processing apparatus 1E and the first maintenance opening 3c1 of the substrate processing apparatus 1F are provided between the second exhaust box 42a of the substrate processing apparatus 1E and the first exhaust box 41a of the substrate processing apparatus 1F in the Y-axis direction. That is, the exhaust section 4 and the gas supply 5 are not provided between the second maintenance opening 3c2 of the substrate processing apparatus 1E and the first maintenance opening 3c1 of the substrate processing apparatus 1F. In this case, an area between the second exhaust box 42a of the substrate processing apparatus 1E and the first exhaust box 41a of the substrate processing apparatus 1F becomes a shared maintenance area in which the second maintenance opening 3c2 of the substrate processing apparatus 1E and the first maintenance opening 3c1 of the substrate processing apparatus 1F are exposed.

The first maintenance door 371 horizontally rotates to open and close the first maintenance opening 3c1. The first maintenance door 371 includes the first hinge 371a and the first door body 371b. The first hinge 371a connects the second sidewall 3b to the first door body 371b. The first hinge 371a is provided, for example, on the boundary between the second non-inclined portion 30 and the second inclined portion 3p. The first door body 371b may be horizontally rotatable with respect to the second sidewall 3b via the first hinge 371a. When the first door body 371b is opened, each of the first processing container 31 and the first boat 33 can be loaded and unloaded through the first maintenance opening 3c1. In FIG. 8, the first door body 371b in an open state is illustrated by a solid line, the first door body 371b in a closed state is illustrated by a broken line, and the trace of the tip of the first door body 371b when the first door body 371b is opened and closed is illustrated by a dotted line.

The second maintenance door 372 horizontally rotates to open and close the second maintenance opening 3c2. The second maintenance door 372 includes the second hinge 372a and the second door body 372b. The second hinge 372a connects the second sidewall 3b to the second door body 372b. The second hinge 372a is provided, for example, on the boundary between the second non-inclined portion 30 and the second inclined portion 3q. The second door body 372b may be horizontally rotatable with respect to the second sidewall 3b via the second hinge 372a. When the second door body 372b is opened, each of the second processing container 32 and the second boat 34 can be loaded and unloaded through the second maintenance opening 3c2. In FIG. 8, the second door body 372b in an open state is illustrated by a solid line, the second door body 372b in a closed state is illustrated by a broken line, and the trace of the tip of the second door body 372b when the second door body 372b is opened and closed is illustrated by a dotted line.

When viewed in the Z-axis direction, the rotation trace of the first door body 371b of the substrate processing apparatus 1F may overlap the rotation trace of the second door body 372b of the substrate processing apparatus 1E.

As described above, according to the substrate processing apparatus 1E, each second inclined portion of the pair of second inclined portions 3p and 3q is located further to the first sidewall 3a with increasing the distance from the intermediate position of the second sidewall 3b in the Y-axis direction. In this case, without changing the opening widths of the respective maintenance openings (the first maintenance opening 3c1 and the second maintenance opening 3c2), the length occupied by the respective maintenance openings in the width direction of the substrate processing apparatus 1E is reduced. This can reduce the width of the substrate processing apparatus 1E. Additionally, the exhaust section 4 and the gas supply 5 are not provided between the second maintenance opening 3c2 of the substrate processing apparatus 1E and the first maintenance opening 3c1 of the substrate processing apparatus 1F. In this case, the maintenance area can be shared among the substrate processing apparatus 1E and the substrate processing apparatus 1F disposed adjacent to the substrate processing apparatus 1E. As described above, the two substrate processing apparatuses 1E and 1F disposed adjacent to each other form a maintenance area having the width (the length in the Y-axis direction) substantially the same as the width of the maintenance area of the substrate processing apparatuses 1C and 1D.

It should be considered that the embodiments disclosed herein are illustrative in all respects and are not restrictive. The above-described embodiments may be omitted, replaced, and changed in various forms without departing from the scope and spirit of the appended claims.

According to the present disclosure, the exhaust efficiency can be improved while the footprint is reduced.

What is claimed is:

1. A substrate processing apparatus comprising:
a processing module including a first sidewall and a second sidewall that are spaced apart in a first horizontal direction; and
a substrate transfer device configured to transfer a substrate to the processing module, the substrate transfer device being disposed adjacent to the first sidewall, and the substrate transfer device including an arm,
wherein the processing module includes a first processing container and a second processing container that are adjacent to each other in a second horizontal direction perpendicular to the first horizontal direction,
wherein a maintenance opening is provided in the second sidewall, the maintenance opening being common for performing maintenance on the first processing container and the second processing container,
wherein the maintenance opening is provided to include an intermediate position between the first processing container and the second processing container in the second horizontal direction,
wherein the second sidewall has a pair of second inclined portions disposed in a V-shape to have a second vertex protruding toward the first sidewall when viewed in a vertical direction, and
wherein the second vertex is positioned between the first processing container and the second processing container when viewed in a vertical direction.

2. The substrate processing apparatus as claimed in claim 1,
wherein the maintenance opening is continuously provided over an area from one of the second inclined portions in the pair to another of the second inclined portions in the pair.

3. The substrate processing apparatus as claimed in claim 2, wherein the processing module includes a maintenance door configured to rotate horizontally to open and close the maintenance opening.

4. The substrate processing apparatus as claimed in claim 3, wherein the processing module includes a clean section attached to the maintenance door, and the clean section supplies clean air into the processing module.

5. The substrate processing apparatus as claimed in claim 1, further comprising a first exhaust box and a second exhaust box disposed spaced apart in the second horizontal direction and that are adjacent to the second sidewall,
wherein the first exhaust box accommodates a first exhaust pipe configured to exhaust an inside of the first processing container, and
wherein the second exhaust box accommodates a second exhaust pipe configured to exhaust an inside of the second processing container.

6. The substrate processing apparatus as claimed in claim 1, wherein the maintenance opening has a size sufficient to allow each of the first processing container and the second processing container to pass through the maintenance opening.

7. A substrate processing apparatus comprising:
a processing module including a first sidewall and a second sidewall that are spaced apart in a first horizontal direction; and
a substrate transfer device configured to transfer a substrate to the processing module, the substrate transfer device being disposed adjacent to the first sidewall, and the substrate transfer device including an arm,
wherein the processing module includes a first processing container and a second processing container that are adjacent to each other in a second horizontal direction perpendicular to the first horizontal direction,
wherein the second sidewall has a pair of second inclined portions disposed in a V-shape when viewed in a vertical direction, and a pair of second non-inclined portions, the pair of second inclined portions being disposed between the pair of second non-inclined portions,
wherein a first maintenance opening is provided in one of the second inclined portions in the pair, the first maintenance opening being provided for performing maintenance on the first processing container,
wherein a second maintenance opening is provided in another of the second inclined portions in the pair, the second maintenance opening being provided for performing maintenance on the second processing container,
wherein the processing module includes a first maintenance door and a second maintenance door, the first maintenance door being configured to rotate horizontally to open and close the first maintenance opening, and the second maintenance door being configured to rotate horizontally to open and close the second maintenance opening,
wherein a rotation trace of the first maintenance door overlaps a rotation trace of the second maintenance door when viewed in the vertical direction,
wherein the first maintenance door includes a first hinge at a boundary between the one of the second inclined portions and one of the second non-inclined portions, and
wherein the second maintenance door includes a second hinge at a boundary between the another of the second inclined portions and another of the second non-inclined portions.

8. The substrate processing apparatus as claimed in claim 7, wherein the pair of second inclined portions has a second vertex protruding toward the first sidewall.

9. The substrate processing apparatus as claimed in claim 8, wherein the second vertex is positioned between the first processing container and the second processing container in the second horizontal direction.

10. The substrate processing apparatus as claimed in claim 7, wherein the first sidewall has a pair of first inclined portions disposed in a V-shape having a first vertex protruding toward the second sidewall when viewed in the vertical direction, and wherein the first vertex is positioned between the first processing container and the second processing container in the second horizontal direction.

11. The substrate processing apparatus as claimed in claim 7, further comprising a first exhaust box and a second exhaust box that are disposed spaced apart in the second horizontal direction and that are adjacent to the second sidewall, wherein the first exhaust box accommodates a first exhaust pipe configured to exhaust an inside of the first processing container, and wherein the second exhaust box accommodates a second exhaust pipe configured to exhaust an inside of the second processing container.

12. The substrate processing apparatus as claimed in claim 7, wherein each of the second inclined portions in the pair is located further to the first sidewall with increasing a distance from an intermediate position of the second sidewall in the second horizontal direction.

13. The substrate processing apparatus as claimed in claim 12, further comprising a first exhaust box and a second exhaust box that are disposed between the first maintenance opening and the second maintenance opening in the second horizontal direction and that are adjacent to the second sidewall, wherein the first exhaust box accommodates a first exhaust pipe configured to exhaust an inside of the first processing container, and wherein the second exhaust box accommodates a second exhaust pipe configured to exhaust an inside of the second processing container.

\* \* \* \* \*